United States Patent
Zeng et al.

(10) Patent No.: US 9,490,024 B1
(45) Date of Patent: Nov. 8, 2016

(54) SOLID STATE STORAGE DEVICE AND READING CONTROL METHOD THEREOF

(71) Applicant: LITE-ON TECHNOLOGY CORPORATION, Taipei (TW)

(72) Inventors: Shih-Jia Zeng, Taipei (TW); Jen-Chien Fu, Taipei (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 14/948,800

(22) Filed: Nov. 23, 2015

(30) Foreign Application Priority Data

Sep. 17, 2015 (CN) .......................... 2015 1 0594881

(51) Int. Cl.
| | |
|---|---|
| *G11C 16/30* | (2006.01) |
| *G11C 16/34* | (2006.01) |
| *G11C 16/08* | (2006.01) |
| *G11C 16/26* | (2006.01) |

(52) U.S. Cl.
CPC ........... *G11C 16/3404* (2013.01); *G11C 16/08* (2013.01); *G11C 16/26* (2013.01)

(58) Field of Classification Search
CPC ....................................................... G11C 16/30
USPC ................................................... 365/185.18
See application file for complete search history.

(56) References Cited

U.S. PATENT DOCUMENTS

| | | | |
|---|---|---|---|
| 2015/0269992 A1* | 9/2015 | Hara | G11C 11/5628 365/185.03 |
| 2016/0093396 A1* | 3/2016 | Alhussien | H03M 13/1125 365/185.21 |
| 2016/0141037 A1* | 5/2016 | Kim | G11C 16/107 714/764 |
| 2016/0148702 A1* | 5/2016 | Karakulak | G11C 16/26 365/185.12 |

* cited by examiner

*Primary Examiner* — Min Huang
(74) *Attorney, Agent, or Firm* — WPAT, PC; Justin King

(57) ABSTRACT

A reading control method for a solid state storage device includes following steps. If a hard decoding process fails, a first histogram parameter and a second histogram parameter are generated in the hard decoding process according to a first sensing voltage, a second sensing voltage and a third sensing voltage. Then, a voltage shift amount is obtained according to the first histogram parameter, the second histogram parameter and a voltage shift function. The first sensing voltage, the second sensing voltage and the third sensing voltage are updated according to the voltage shift amount. Then, a soft decoding process is performed. The updated first sensing voltage, the updated second sensing voltage and the updated third sensing voltage are provided to a non-volatile memory, so that the non-volatile memory generates a soft data.

11 Claims, 7 Drawing Sheets

|  | h1 | h2 | Voltage shift amount |
|---|---|---|---|
| set1 | 500 | 2500 | -8 |
| set2 | 1500 | 1500 | 0 |
| set3 | 2000 | 1000 | +4 |
| ⋮ | ⋮ | ⋮ | ⋮ |

FIG. 5

|      | h1   | h2   | Probability |
|------|------|------|-------------|
| set1 | 500  | 2500 | -1          |
| set2 | 1500 | 1500 | +1          |
| set3 | 2000 | 1000 | +1          |
| ⋮    | ⋮    | ⋮    | ⋮           |

FIG. 7

SOLID STATE STORAGE DEVICE AND READING CONTROL METHOD THEREOF

This application claims the benefit of People's Republic of China Application Serial No. 201510594881.9, filed Sep. 17, 2015, the subject matter of which is incorporated herein by reference.

FIELD OF THE INVENTION

The present invention relates to a solid state storage device and a control method thereof, and more particularly to a solid state storage device and a reading control method thereof.

BACKGROUND OF THE INVENTION

As is well known, solid state storage devices such as SD card or solid state drive (SSD) are widely used in a variety of electronic devices. Generally, a solid state storage device comprises a controlling circuit and a non-volatile memory.

Moreover, a NAND-based flash memory is one kind of non-volatile memory. Depending on the amount of data to be stored, the NAND-based flash memories may be classified into three types, i.e. a single-level cell (SLC) flash memory, a multi-level cell (MLC) flash memory and a triple-level cell (TLC) flash memory. The SLC flash memory can store only one bit of data per cell. The MLC flash memory can store two bits of data per cell. The TLC flash memory can store three bits of data per cell.

FIG. 1 is a schematic functional block diagram illustrating a conventional solid state storage device. As shown in FIG. 1, the solid state storage device 10 is connected with a host 14 through an external bus 12. Generally, the external bus 12 is a USB bus, a SATA bus, a PCIe bus, or the like. Moreover, the solid state storage device 10 comprises a controlling circuit 101 and a non-volatile memory 105. The controlling circuit 101 is connected with the non-volatile memory 105 through an internal bus 107. According to a command from the host 14, the controlling circuit 101 stores the received write data into the non-volatile memory 105, or the controlling circuit 101 acquires a read data from the non-volatile memory 105 and transmits the read data to the host 14.

The controlling circuit 101 further comprises an error correction code (ECC) unit 104 for correcting the error bits of the read data. After the error bits of the read data are corrected, accurate read data are transmitted to the host 14.

FIG. 2A schematically illustrates the architecture of cells in the non-volatile memory of the solid state storage device. The non-volatile memory 105 has a memory array composed of plural cells. Each cell includes a floating gate transistor. The memory array comprises plural word lines WL(n−1), WL(n) and WL(n+1) for controlling respective rows of cells. When one of the plural word lines is activated, a selected row corresponding to the activated word line is determined. According to the on/off states of the floating gate transistors of the cells in the selected row, the storing states of the cells are determined. Moreover, the cells are SLC, MLC or TLC.

Generally, the floating gate transistor of each cell has a floating gate to store hot carriers. A threshold voltage ($V_{TH}$) of the floating gate transistor is determined according to the amount of the stored hot carriers. If a floating gate transistor has a higher threshold voltage, it means that a higher gate voltage is required to turn on the floating gate transistor. Whereas, if a floating gate transistor has a lower threshold voltage, it means that the floating gate transistor can be turned on by a lower gate voltage.

During a program cycle of the solid state storage device, the amount of hot carriers to be injected into the floating gate is controlled by the controlling circuit 101, so that the floating gate transistor is correspondingly changed. During a read cycle, the controlling circuit 101 determines the storing state of the floating gate transistor by judging whether the floating gate transistor is turned on.

FIG. 2B schematically illustrates the threshold voltage distribution curves of the SLC flash memory in different storing states. Generally, each cell of the SLC flash memory has two storing states E and A according to the amount of the injected hot carriers. Before the hot carriers are injected into the cell, the cell has the storing state E (e.g., a logic state "1"). After the hot carriers are injected into the cell, the cell has the storing state A (e.g., a logic state "0"). The threshold voltage of the cell in the storing state A is higher, and the threshold voltage of the cell in the storing state E is lower. After an erase cycle, the cell is returned to the storing state E where no hot carriers are injected into the cell.

Moreover, each cell of the MLC flash memory has four storing states, and each cell of the TLC flash memory has eight storing states. Hereinafter, only the cells of the SLC flash memory will be described. It is noted that the concepts of the present invention are also applied to the MLC flash memory and the TLC flash memory.

In practical, even if many cells are in the same storing state during the program cycle, the threshold voltages of these cells are not all identical. That is, the threshold voltages of these cells are distributed in a specified distribution curve with a median threshold voltage. As shown in FIG. 2B, the cells in the storing state E have a median threshold voltage $V_{THE}$ (e.g. 0V), and the cells in the storing state A have a median threshold voltage $V_{THA}$ (e.g. 20V). In other words, a greater number of the cells in the storing state A have the median threshold voltage $V_{THA}$ (e.g. characteristics of the SLC flash memory, a first sensing voltage Vs1 is defined. During the read cycle, the controlling circuit 101 applies the first sensing voltage Vs1 to the word line, and the storing state of each cell of the SLC flash memory is realized by judging whether the cell is turned on. If the threshold voltage of the cell is lower than the first sensing voltage Vs1 and the cell is turned on, the controlling circuit 101 judges that the cell is in the storing state E. Whereas, if the threshold voltage of the cell is higher than the first sensing voltage Vs1 and the cell fails to be turned on, the controlling circuit 101 judges that the cell is in the storing state A.

For example, in the non-volatile memory 105 of FIG. 2B, p cells are programmed to have the storing state E, and w cells are programmed to have the storing state A.

When the p cells in the storing state E are detected according to the first sensing voltage Vs1, only (p−q) cells with the threshold voltages lower than the first sensing voltage Vs1 are confirmed to have the storing state E. However, the other q cells with the threshold voltages higher than the first sensing voltage Vs1 are erroneously judged to have the storing state A. Similarly, when the w cells in the storing state A are detected according to the first sensing voltage Vs1, only (w−x) cells with the threshold voltages higher than the first sensing voltage Vs1 are confirmed to have the storing state A. However, the other x cells with the threshold voltages lower than the first sensing voltage Vs1 are erroneously judged to have the storing state E.

As mentioned above, during the read cycle of the solid state storage device 10, the controlling circuit 101 applies the first sensing voltage Vs1 to the non-volatile memory 105. In the generated read data, the storing states of (q+x) cells are erroneously judged and these (q+x) cells are also referred as error bits. If the number of the erroneously-judged cells is small, the ECC unit 104 can correct the erroneously-judged cells and output the accurate read data. However, if the number of the erroneously-judged cells is large, the ECC unit 104 cannot effectively correct the erroneously-judged cells. Under this circumstance, the controlling circuit 101 cannot output the accurate read data.

Generally, the conventional ECC unit 104 comprises a BCH decoder. The controlling circuit 101 with the BCH decoder uses a single first sensing voltage Vs1 to judge the storing state of the non-volatile memory 105.

Moreover, the BCH decoder is a hard decoder for performing a hard decoding process. After the first sensing voltage Vs1 is provided to the non-volatile memory 105, the output data is referred as hard data. The BCH decoder corrects the error bits of the hard data according to the hard data and generates the accurate read data.

FIG. 2C is a flowchart illustrating a hard decoding process of the conventional solid state storage device. In case that the ECC unit 104 of the controlling circuit 101 contains the BCH decoder, the solid state storage device 10 may perform the hard decoding process. Firstly, the controlling circuit 101 provides a default first sensing voltage Vs1 to the non-volatile memory 105 and performs a decoding operation according to the generated hard data (Step S302).

If the decoding operation is successfully completed by the ECC unit 104 according to the hard data (Step S304), it means that the error bits in the hard data can be corrected. Consequently, the controlling circuit 101 outputs the read data (Step S310). Whereas, if the decoding operation is not successfully completed according to the hard data (Step S304), the error bits in the hard data cannot be effectively corrected because the number of error bits is too large. Consequently, the controlling circuit 101 performs a read retry step (Step S305).

While the read retry step S305 is performed, the controlling circuit 101 updates the first sensing voltage Vs1, provides the updated first sensing voltage Vs1 to the non-volatile memory 105, and performs a decoding operation according to the generated hard data (Step S306). Then, a step S308 is performed to judge whether the decoding operation is successfully completed.

In particular, during the process of performing the read retry step S305, the controlling circuit 101 sequentially provides M values (e.g., 20 values) of the first sensing voltage Vs1 to the non-volatile memory 105. The M values of the first sensing voltage Vs1 are previously stored in the controlling circuit 101 before the solid state storage device 10 leaves the factory. That is, these M values are sequentially used as the updated values of the first sensing voltage Vs1. If the decoding operation is successfully completed according to the hard data corresponding to the updated first sensing voltage Vs1, the controlling circuit 101 outputs the read data (Step S310). Whereas, if the decoding operation is not successfully completed according to the hard data corresponding to all of the M updated values of the updated first sensing voltage Vs1, the controlling circuit 101 generates a failed message to indicate that the read retry step fails. In other words, the steps S306 and S308 are performed M times at most. Moreover, if the controlling circuit 101 confirms that the read retry step fails, the hard decoding process fails.

Moreover, all of the M updated values of the first sensing voltage Vs1 are stored in a retry table of the conventional solid state storage device 10. While the controlling circuit 101 performs the read retry step, it is necessary to acquire the updated first sensing voltage Vs1.

After the solid state storage device 10 leaves the factory, if the solid state storage device has been written and erased many times, the threshold voltage distribution curves of the storing state of all cells in the non-volatile memory 105 are possibly changed. Under this circumstance, the median threshold voltage is shifted. Since it is difficult to realize the change of the threshold voltage distribution curve, the hard decoding process of employing the updated values of the first sensing voltage Vs1 in the retry table is very time-consuming. Under this circumstance, the throughput of the solid state storage device 10 is largely reduced.

SUMMARY OF THE INVENTION

An embodiment of the present invention provides a solid state storage device. The solid state storage device includes a non-volatile memory and a controlling circuit. The controlling circuit is connected with the non-volatile memory. The controlling circuit performs a hard decoding process and a soft decoding process on the non-volatile memory. After the hard decoding process fails, the controlling circuit obtains a first histogram parameter and a second histogram parameter generated in the hard decoding process according to a first sensing voltage, a second sensing voltage and a third sensing voltage. Before the soft decoding process is performed, a voltage shift amount is obtained according to the first histogram parameter, the second histogram parameter and a voltage shift function, and the first sensing voltage, the second sensing voltage and the third sensing voltage are updated according to the voltage shift amount. The non-volatile memory generates a soft data according to the updated first sensing voltage, the updated second sensing voltage and the updated third sensing voltage.

Another embodiment of the present invention provides a solid state storage device. The solid state storage device includes a non-volatile memory and a controlling circuit. The controlling circuit is connected with the non-volatile memory. The controlling circuit performs a hard decoding process and a soft decoding process on the non-volatile memory. After the hard decoding process fails, the controlling circuit obtains a first histogram parameter and a second histogram parameter generated in the hard decoding process. Before the soft decoding process is performed, the controlling circuit generates a probability value according to the first histogram parameter, the second histogram parameter and a decoding probability function. According to the probability value, the controlling circuit determines whether the soft decoding process is performed or not.

A further embodiment of the present invention provides a reading control method for a solid state storage device. The reading control method includes the following steps. Firstly, a hard decoding process on a non-volatile memory is performed. If the hard decoding process fails, a controlling circuit obtains a first histogram parameter and a second histogram parameter generated in the hard decoding process according to a first sensing voltage, a second sensing voltage and a third sensing voltage. Then, a voltage shift amount is obtained according to the first histogram parameter, the second histogram parameter and a voltage shift function. The first sensing voltage, the second sensing voltage and the third sensing voltage are updated according to the voltage shift amount. Then, a soft decoding process is performed on the non-volatile memory. The updated first sensing voltage, the updated second sensing voltage and the updated third sensing voltage are provided to the non-volatile memory, so that the non-volatile memory generates a soft data.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which:

FIG. 5 schematically illustrates a database storing associated data in various disturbing conditions;

FIG. 7 schematically illustrates another database storing associated data in various disturbing conditions.

DETAILED DESCRIPTION OF PREFERRED EMBODIMENTS

The present invention provides a solid state storage device and a reading control method thereof. The reading control method is applied to a soft decoding process of the solid state storage device. Before the soft decoding process is performed, a controlling circuit calculates a voltage shift amount according to two histogram parameters obtained in a hard decoding process and a voltage shift function, and generates three updated sensing voltages according to the voltage shift amount. Moreover, the controlling circuit calculates a probability value. The probability value indicating the successful decoding probability of the soft decoding process is calculated according to two histogram parameters generated in the hard decoding process and a decoding probability function.

Figure 1:
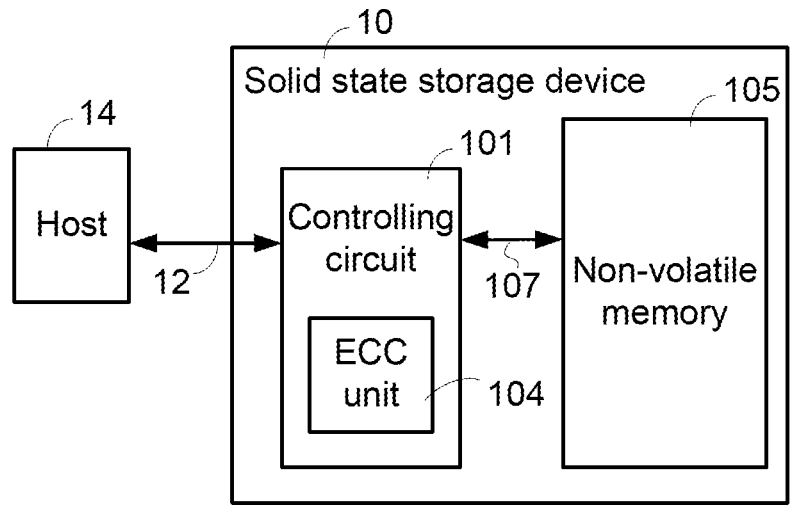
FIG. 1 (prior art) is a schematic functional block diagram illustrating a conventional solid state storage device.
Figure 2A:
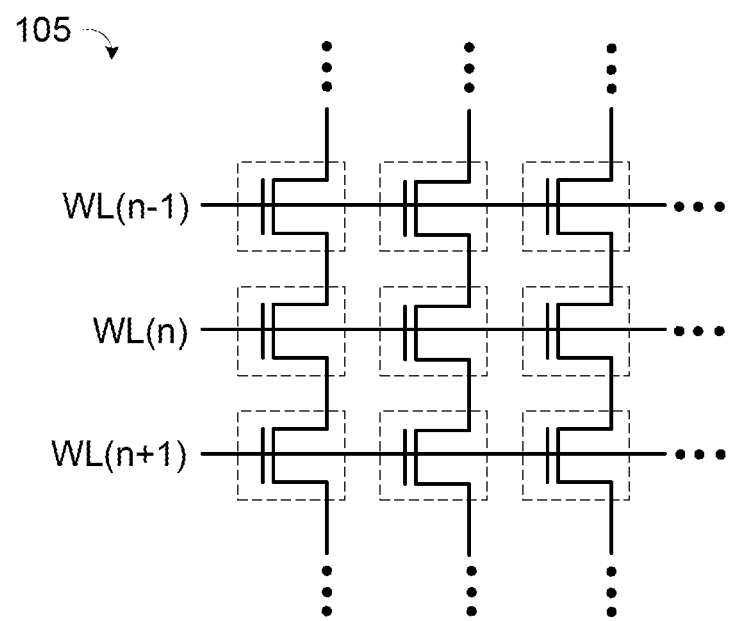
FIG. 2A (prior art) schematically illustrates the architecture of cells in the non-volatile memory of the solid state storage device.
Figure 2B:
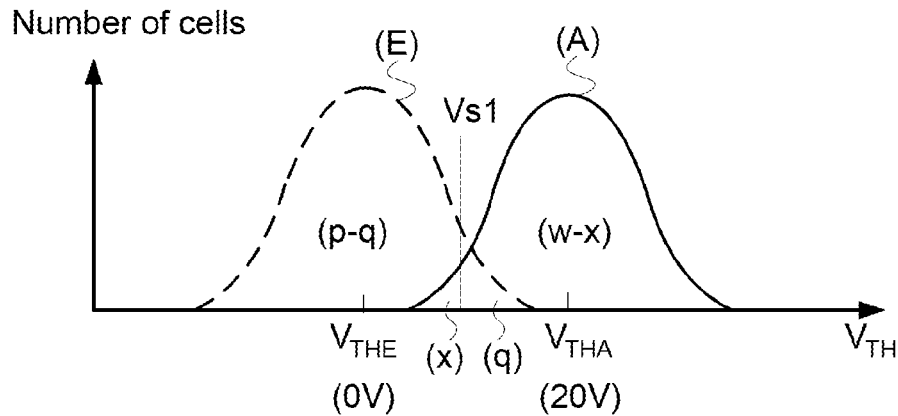
FIG. 2B (prior art) schematically illustrates the threshold voltage distribution curves of the SLC flash memory in different storing states.
Figure 2C:
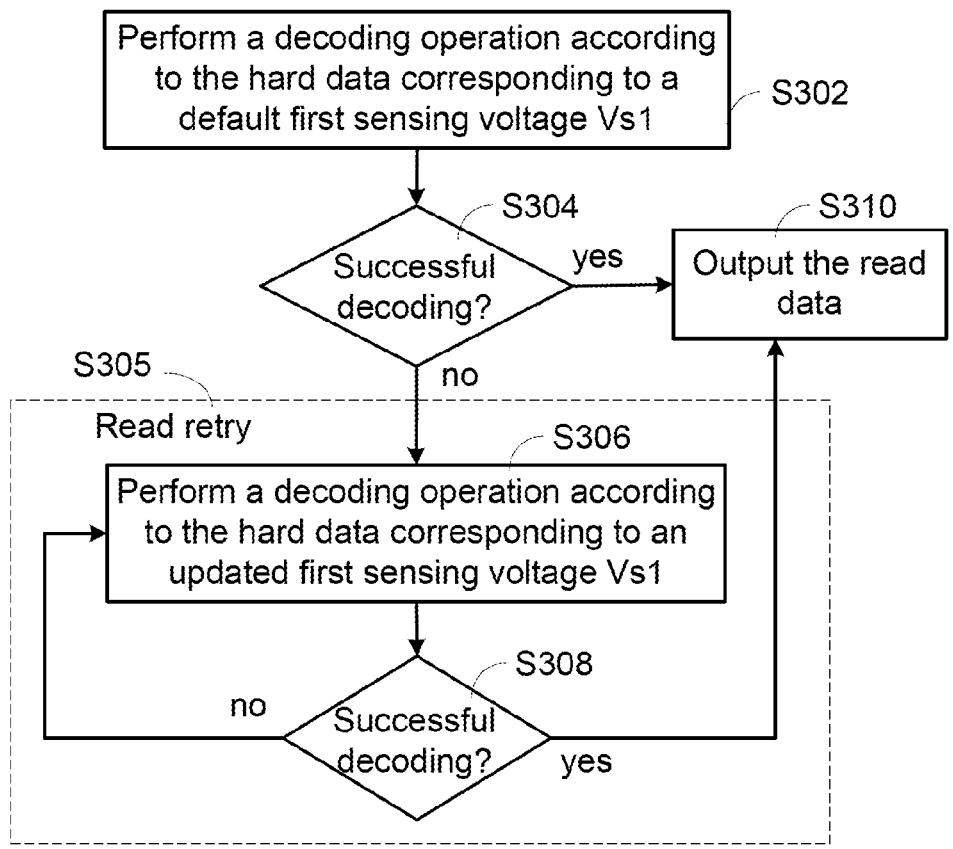
FIG. 2C (prior art) is a flowchart illustrating a hard decoding process of the conventional solid state storage device.
Figure 3A:
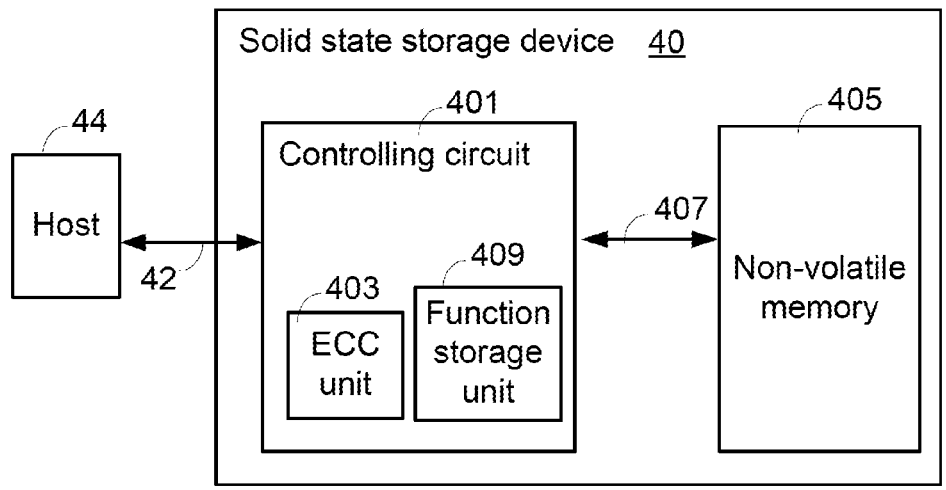
FIG. 3A is a schematic functional block diagram illustrating a solid state storage device according to an embodiment of the present invention.

FIG. 3A is a schematic functional block diagram illustrating a solid state storage device according to an embodiment of the present invention. As shown in FIG. 3A, the solid state storage device 40 is connected with a host 44 through an external bus 42. Generally, the external bus 42 is a USB bus, a SATA bus, a PCIe bus, or the like. Moreover, the solid state storage device 40 comprises a controlling circuit 401 and a non-volatile memory 405. The controlling circuit 401 is connected with the non-volatile memory 405 through an internal bus 407. According to a command from the host 44, the controlling circuit 401 stores the received write data into the non-volatile memory 405, or the controlling circuit 401 acquires a read data from the non-volatile memory 405 and transmits the read data to the host 44.

The controlling circuit 401 further comprises an error correction code (ECC) unit 403 for correcting the error bits of the read data. After the error bits of the read data are corrected, accurate read data are transmitted to the host 44. In this embodiment, the ECC unit 403 comprises a hard decoder and a soft decoder. For example, the hard decoder is a BCH decoder, and the soft decoder is a LDPC decoder.

Moreover, the controlling circuit 401 further comprises a function storage unit 409. The function storage unit 409 is used for storing a voltage shift function and a decoding probability function. Both of the voltage shift function and the decoding probability function are related to two histogram parameters.

For increasing the capability of correcting the error data, the solid state storage device 40 further uses the soft decoder (e.g., the LDPC decoder) to correct the error bits. As mentioned above, the BCH decoder only uses a single sensing voltage to judge the storing states of the cells of the non-volatile memory 405. In contrast, the LDPC decoder has to use plural sensing voltages to judge the storing states of the cells of the non-volatile memory 405. The method of using the plural sensing voltages to judge the storing states of the cells of the non-volatile memory 405 by the LDPC decoder will be illustrated as follows.

Figure 3B:
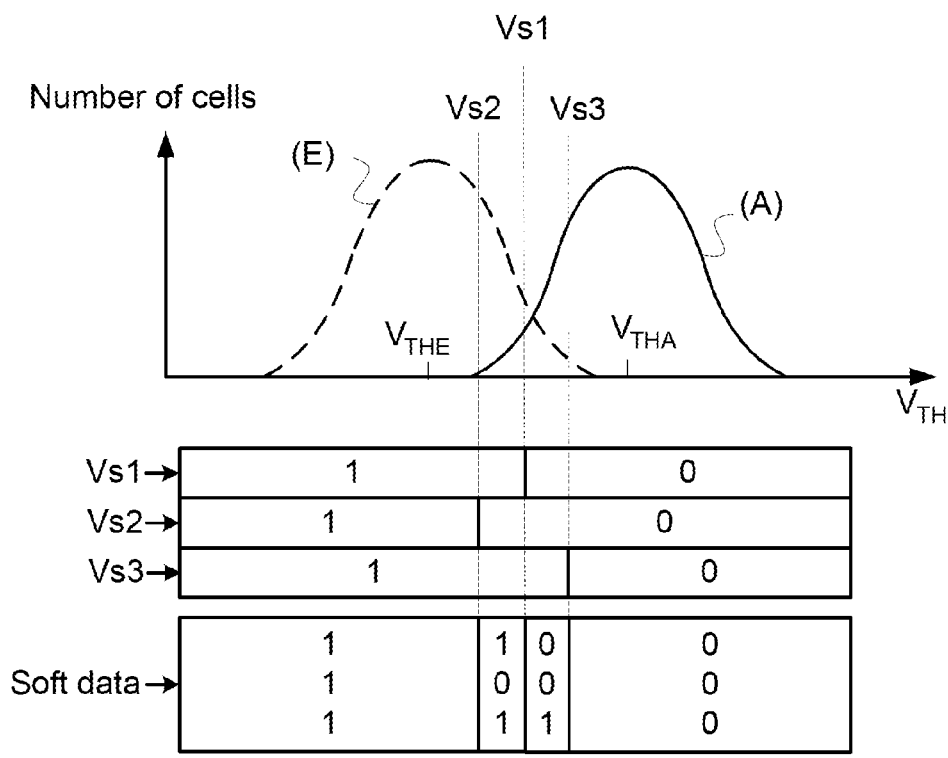
FIG. 3B schematically illustrates a method of using plural sensing voltages to judge the storing states of the cells of the non-volatile memory.

FIG. 3B schematically illustrates a method of using plural sensing voltages to judge the storing states of the cells of the non-volatile memory. Firstly, the controlling circuit 401 provides a first sensing voltage Vs1 to all cells. If the threshold voltage of the cell is lower than the first sensing voltage Vs1, the controlling circuit 401 judges that the cell is in a storing state E (e.g., a logic state "1"). Whereas, if the threshold voltage of the cell is higher than the first sensing voltage Vs1, the controlling circuit 401 judges that the cell is in a storing state A (e.g., a logic state "0").

The controlling circuit 401 further provides a second sensing voltage Vs2 to all cells. If the threshold voltage of the cell is lower than the second sensing voltage Vs2, the controlling circuit 401 judges that the cell is in the storing state E (e.g., the logic state "1"). Whereas, if the threshold voltage of the cell is higher than the second sensing voltage Vs2, the controlling circuit 401 judges that the cell is in the storing state A (e.g., the logic state "0").

The controlling circuit 401 further provides a third sensing voltage Vs3 to all cells. If the threshold voltage of the cell is lower than the third sensing voltage Vs3, the controlling circuit 401 judges that the cell is in the storing state E (e.g., the logic state "1"). Whereas, if the threshold voltage of the cell is higher than the third sensing voltage Vs3, the controlling circuit 401 judges that the cell is in the storing state A (e.g., the logic state "0"). In this embodiment, the second sensing voltage Vs2 is lower than the first sensing voltage Vs1, and the first sensing voltage Vs1 is lower than the third sensing voltage Vs3.

After the three sensing voltages Vs1, Vs2 and Vs3 are provided to the non-volatile memory 405, all of the cells are divided into four groups by the controlling circuit 401. As shown in FIG. 3B, the cells whose threshold voltages are lower than the second sensing voltage Vs2 are denoted as "111", the cells whose threshold voltages are in the range between the second sensing voltage Vs2 and the first sensing voltage Vs1 are denoted as "101", the cells whose threshold voltages are in the range between the first sensing voltage Vs1 and the third sensing voltage Vs3 are denoted as "001", and the cells whose threshold voltages are higher than the third sensing voltage Vs3 are denoted as "000". Moreover, the number of the cells denoted as "101" is a first histogram parameter h1, and the number of cells denoted as "001" is a second histogram parameter h2.

For example, the cells denoted as "111" has a much higher probability (e.g., 98%) in the storing state E, the cells denoted as "101" has a higher probability (e.g., 60%) in the storing state E, the cells denoted as "001" has a higher probability (e.g., 60%) in the storing state A, and the cells denoted as "000" has a much higher probability (e.g., 98%) in the storing state A. The data about the probabilities are also referred as soft data. The LDPC decoder generates the accurate read data according to the soft data.

When compared with the BCH decoder, the LDPC has better capability of correcting the error bits. However, since the soft decoding process uses three sensing voltages Vs1, Vs2 and Vs3 to perform the reading action three times, the soft decoding process needs a long decoding time period. Moreover, if the decoding operation is not successfully completed by the soft decoding process, the uses of the updated values of the three sensing voltages will largely reduce the throughput of the solid state storage device 40.

Figure 4:
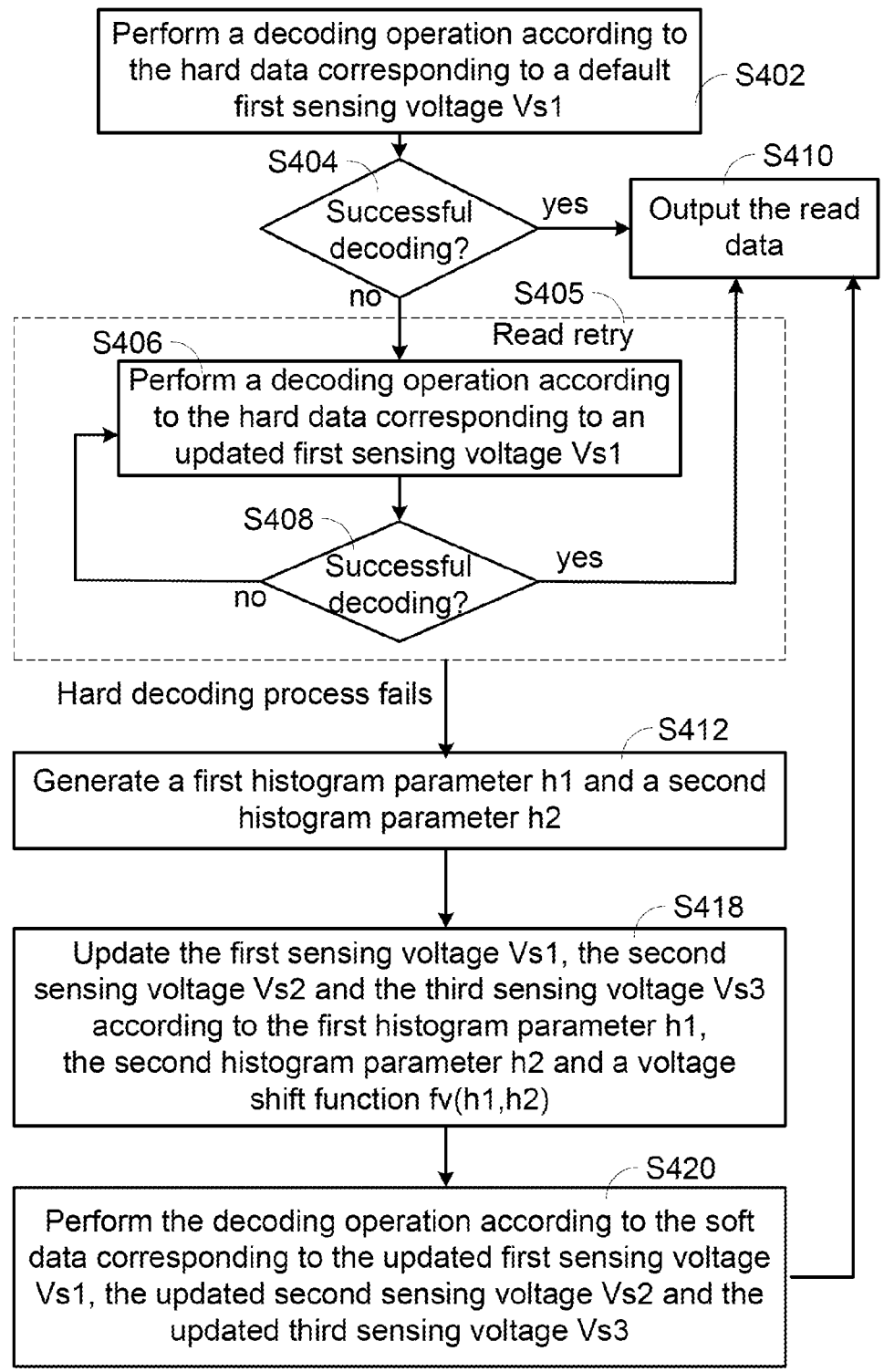
FIG. 4 is a flowchart illustrating a reading control method for a solid state storage device according to a first embodiment of the present invention.

FIG. 4 is a flowchart illustrating a reading control method for a solid state storage device according to a first embodiment of the present invention. As mentioned above, the controlling circuit 401 of the solid state storage device 40 further comprises the error correction code (ECC) unit 403. In this embodiment, the ECC unit 403 comprises a hard decoder and a soft decoder. For example, the hard decoder is a BCH decoder, and the soft decoder is a LDPC decoder.

Firstly, a hard decoding process is performed by the hard decoder. The controlling circuit 401 provides a default first sensing voltage Vs1 to the non-volatile memory 405 and performs a decoding operation according to the generated hard data (Step S402).

If the decoding operation is successfully completed by the ECC unit 403 according to the hard data (Step S404), the error bits in the hard data can be corrected. Consequently, the controlling circuit 401 outputs the read data (Step S410). Whereas, if the decoding operation is not successfully completed according to the hard data (Step S404), the error bits in the hard data cannot be effectively corrected because the number of error bits is too large. Consequently, the controlling circuit 401 performs a read retry step (Step S405).

While the read retry step S405 is performed, the controlling circuit 401 updates the first sensing voltage Vs1, provides the updated first sensing voltage Vs1 to the non-volatile memory 405, and performs the decoding operation according to the generated hard data (Step S406). Then, a step S408 is performed to judge whether the decoding operation is successfully completed.

In particular, during the process of performing the read retry step S405, the controlling circuit 401 sequentially provides M values of the first sensing voltage Vs1 to the non-volatile memory 405. The M values of the first sensing voltage Vs1 are previously stored in the controlling circuit 401 before the solid state storage device 40 leaves the factory. That is, these M values are sequentially used as the updated values of the first sensing voltage Vs1.

If the decoding operation is successfully completed according to the hard data corresponding to the updated first sensing voltage Vs1, the controlling circuit 401 outputs the read data (Step S410). Whereas, if the decoding operation is not successfully completed according to the hard data corresponding to all of the M updated values of the updated first sensing voltage Vs1, the controlling circuit 401 generates a failed message to indicate the failed read retry step. In other words, the steps S406 and S408 are performed M times. Moreover, if the controlling circuit 401 confirms that the read retry step fails, the hard decoding process fails. Next, a soft decoding process will be performed. In a preferred embodiment, the soft decoding process is performed after the controlling circuit 401 performs the read retry step S405 only several times (e.g., two times or more).

In this embodiment, at least two updated values of the first sensing voltages Vs1 and the default first sensing voltages Vs1 are required in the read retry step (i.e., the step S405). That is, three sensing voltages are used to generate three hard data. According to the three sensing voltages, the first histogram parameter h1 and the second histogram parameter h2 as shown in FIG. 3B are calculated. That is, after the read retry step S405 is performed twice, the soft decoding process will be performed. Since the read retry step S405 is performed twice (i.e., not M times) before the soft decoding process is performed, the time period of the decoding process is reduced.

Please refer to FIG. 4 again. In case that the hard decoding process fails, before the soft decoding process is performed, the first histogram parameter h1 and the second histogram parameter h2 are generated according to three different values of the first sensing voltage Vs1 in the hard decoding process (Step S412). Moreover, the three different values of the first sensing voltage Vs1 are defined as the first sensing voltage Vs1, a second sensing voltage Vs2 and a third sensing voltage Vs3, respectively. The second sensing voltage Vs2 is lower than the first sensing voltage Vs1, and the first sensing voltage Vs1 is lower than the third sensing voltage Vs3.

Then, the first sensing voltage Vs1, the second sensing voltage Vs2 and the third sensing voltage Vs3 are updated according to the first histogram parameter h1, the second histogram parameter h2 and a voltage shift function fv(h1, h2) (Step S418). In an embodiment, after the first histogram parameter h1 and the second histogram parameter h2 are introduced into the voltage shift function fv(h1,h2) stored in the function storage unit 409, the updated first sensing voltage Vs1, the updated second sensing voltage Vs2 and the updated third sensing voltage Vs3 are acquired.

Then, the updated first sensing voltage Vs1, the updated second sensing voltage Vs2 and the updated third sensing voltage Vs3 are provided to the non-volatile memory 405, and the decoding operation is performed according to the generated soft data (Step S420). Consequently, the controlling circuit 401 outputs the read data (Step S410).

In this embodiment, the voltage shift function fv(h1,h2) is created by the manufacturer of the solid state storage device 40 and stored in the function storage unit 409 of the controlling circuit 401 before the solid state storage device 40 leaves the factory. The creating method and the application of the voltage shift function fv(h1,h2) will be described as follows.

After the solid state storage device 40 leaves the factory, if the solid state storage device 40 has been written and erased many times, the threshold voltage distribution curves of the storing state of all cells in the non-volatile memory 405 are possibly changed. Under this circumstance, the median threshold voltage is shifted. The changes of the threshold voltage distribution curves are related to the applications of the non-volatile memory 405. For example, program disturbance, data retention and read disturbance may affect the changes of the threshold voltage distribution curves.

Generally, after the non-volatile memory 405 has been written and erased many times, the performance of the cells is possibly deteriorated and the storing states of the cells are erroneously judged. Under this circumstance, the program disturbance occurs. Similarly, after the cells have been programmed and read many times, the performance of the cells is possibly deteriorated and the storing states of the cells are erroneously judged. Under this circumstance, the read disturbance occurs. Moreover, after the cells have been programmed and the data have been stored for a long time, the hot carriers in the cells are gradually lost and the storing states of the cells are erroneously judged. Under this circumstance, the data retention occurs.

According to an embodiment of present invention, before solid state storage device 40 leaves the factory, the non-volatile memory 405 is subjected to various disturbance experiments. After a set of predetermined sensing voltages (e.g., the first sensing voltage Vs1, the second sensing voltage Vs2 and the third sensing voltage Vs3) are applied to disturbed non-volatile memory 405, the first histogram parameter h1, the second histogram parameter h2 and an optimal sensing voltage are acquired.

Take the program disturbance as an example. Firstly, three non-volatile memories that have been programmed 1000 times, 2000 times and 3000 times are provided. The set of predetermined sensing voltages are provided to three non-volatile memories. Consequently, the first histogram parameters h1 and the second histogram parameters h2 for respective non-volatile memories are calculated. In addition, the optimal sensing voltage for these three non-volatile memories is obtained.

That is, the manufacturer can collect the data about the first histogram parameters h1, the second histogram parameters h2 and the optimal sensing voltage in various disturbing conditions. Moreover, according to the optimal sensing voltage, the voltage shift amount of the first sensing voltage Vs1 is realized. In addition, a database is created according to the collected data.

Moreover, the manufacturer may perform regression analysis (e.g., linear regression analysis) on the contents of the database in order to the obtain the voltage shift function fv(h1,h2) of the first histogram parameter h1 and the second histogram parameter h2.

For example, the manufacturer may define a set of predetermined sensing voltages. The set of predetermined sensing voltages includes a first sensing voltage Vs1, a second sensing voltage Vs2 and a third sensing voltage Vs3. For example, the first sensing voltage Vs1 is 15V, the second sensing voltage Vs2 is equal to the difference between the first sensing voltage Vs1 and a fixed voltage $\Delta$V1 (i.e., Vs2=Vs1−$\Delta$V1), and the third sensing voltage Vs3 is equal to the sum of the first sensing voltage Vs1 and a fixed voltage $\Delta$V2 (i.e., Vs3=Vs1+$\Delta$V2). The fixed voltage $\Delta$V1 and the fixed voltage $\Delta$V2 are identical or different. In an embodiment, the fixed voltage $\Delta$V1 and the fixed voltage $\Delta$V2 are identical and equal to 8V. That is, the first sensing voltage Vs1 is 15V, the second sensing voltage Vs2 is 7V, and the third sensing voltage Vs3 is 23V.

After the set of predetermined sensing voltages are provided to the non-volatile memories in various disturbing conditions, the data about the first histogram parameters h1, the second histogram parameters h2 and the optimal sensing voltage are obtained. In addition, a voltage shift amount between the optimal sensing voltage and the first sensing voltage Vs1 is calculated.

FIG. 5 schematically illustrates a database storing associated data in various disturbing conditions. In the condition set1, the first histogram parameter h1 is 500, the second histogram parameter h2 is 2500, and the voltage shift amount between the optimal sensing voltage and the first sensing voltage Vs1 is −8V. In the condition set2, the first histogram parameter h1 is 1500, the second histogram parameter h2 is 1500, and the voltage shift amount between the optimal sensing voltage and the first sensing voltage Vs1 is 0V. In the condition set3, the first histogram parameter h1 is 2000, the second histogram parameter h2 is 1000, and the voltage shift amount between the optimal sensing voltage and the first sensing voltage Vs1 is +4V.

After the regression analysis is performed on the collected data of the database, the voltage shift function fv(h1,h2) is obtained. For example, the voltage shift function fv(h1,h2) is expressed as: fv(h1,h2)−0.004×h1−0.004×h2. The voltage shift function fv(h1,h2) is stored in the function storage unit 409 of the controlling circuit 401.

As mentioned above, in case that the hard decoding process fails, the first histogram parameter h1 and the second histogram parameter h2 are generated according to three different values of the first sensing voltage Vs1 in the hard decoding process (Step S412). Moreover, the three different values of the first sensing voltage Vs1 are defined as the first sensing voltage Vs1, the second sensing voltage Vs2 and the third sensing voltage Vs3, respectively. Meanwhile, the first sensing voltage Vs1, the second sensing voltage Vs2 and the third sensing voltage Vs3 are 7V, 15V and 23V, respectively. In addition, the first histogram parameter h1 and the second histogram parameter h2 are calculated according to the three sensing voltages. For example, the first histogram parameter h1 is 1000, and the second histogram parameter h2 is 2300.

In the step S418, the first histogram parameter h1 (=1000) and the second histogram parameter h2 (=2300) are introduced into the voltage shift function fv(h1,h2), the calculated voltage shift amount is −5.2V. Consequently, the updated first sensing voltage Vs1 is +9.8V (=15V−5.2V), the updated second sensing voltage Vs2 is +1.8V (=7V−5.2V), and the updated third sensing voltage Vs3 is +17.8V (=23V−5.2V).

Next, in the step 420, the updated first sensing voltage Vs1 (+9.8V), the updated second sensing voltage Vs2 (+1.8V), and the updated third sensing voltage Vs3 (+17.8V) are provided to the non-volatile memory 405. Consequently, the decoding operation is performed according to the generated soft data.

From the above descriptions, the present invention provides a solid state storage device and a reading control method thereof. After the hard decoding process fails and before the soft decoding process is performed, the first histogram parameter h1 and the second histogram parameter h2 are generated according to three sensing voltages used in the hard decoding process, and calculates a voltage shift amount according to a voltage shift function. In addition, the three sensing voltages are updated according to the voltage shift amount.

It is noted that numerous modifications and alterations may be made while retaining the teachings of the invention. In another embodiment, at least three sensing voltages are provided to the non-volatile memory in the hard decoding process, and the decoding operation is performed according to the generated hard data. Moreover, after the hard decoding process fails and before the soft decoding process is performed, at least two histogram parameters are generated according to the at least three sensing voltages, and the voltage shift amount is calculated according to the at least two histogram parameters and the voltage shift function. In addition, the three sensing voltages are updated according to the voltage shift amount. Moreover, if the number of the sensing voltages used in the hard decoding process and the number of the generated histogram parameters are increased, the result applied to the voltage shift function is more precise. Since the calculated voltage shift amount is more precise, the decoding result of the subsequent soft decoding process is more precise.

In another embodiment, a decoding probability function fp(h1,h2) is further stored in the function storage unit 409 of the controlling circuit 401. In case that the hard decoding process fails, the successful decoding probability is judged. Consequently, the controlling unit 401 determines whether the soft decoding process is performed or not.

Figure 6:
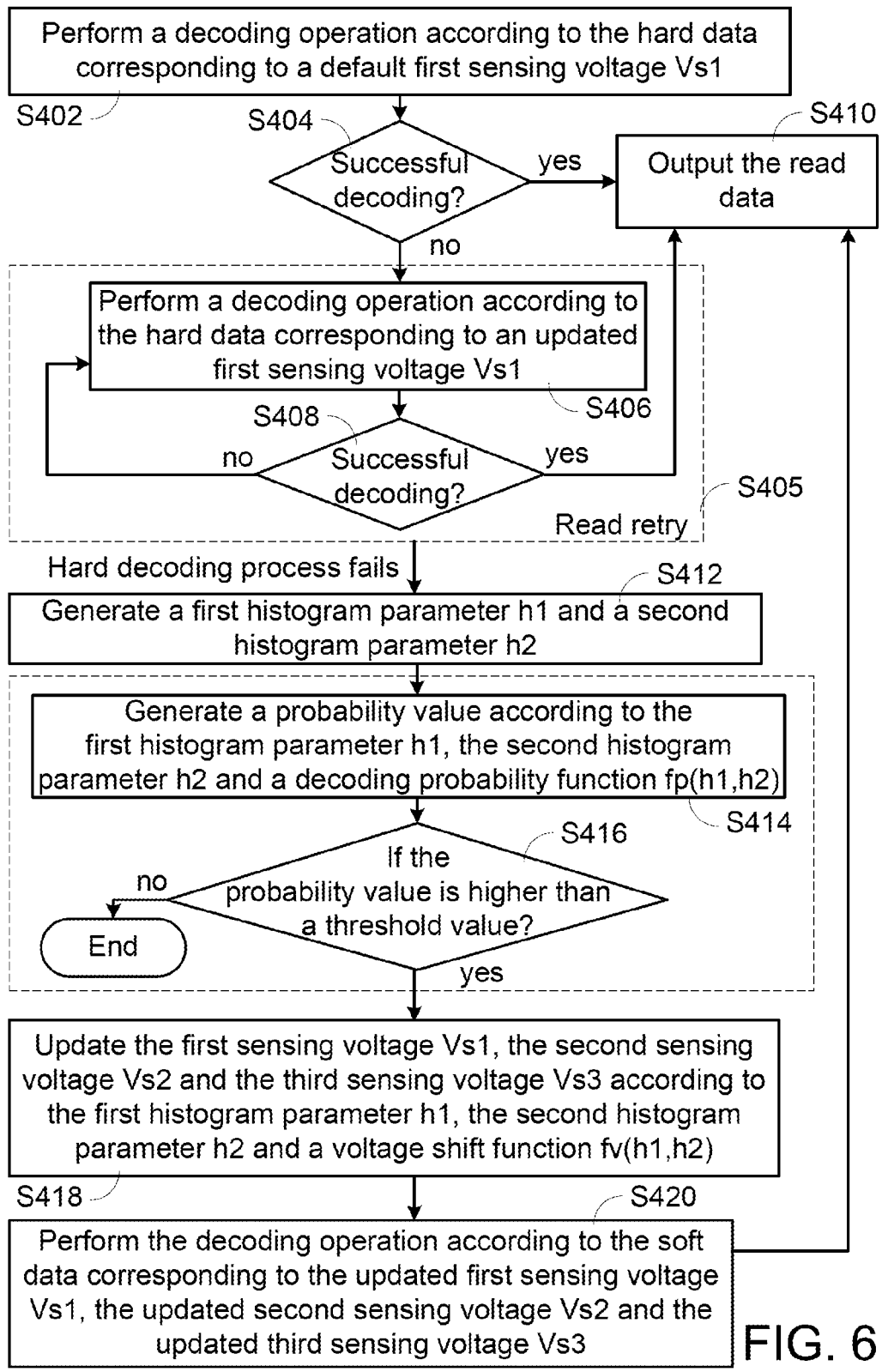
FIG. 6 is a flowchart illustrating a reading control method for a solid state storage device according to a second embodiment of the present invention.

FIG. 6 is a flowchart illustrating a reading control method for a solid state storage device according to a second embodiment of the present invention. In comparison with the first embodiment, the reading control method of this embodiment further comprises the steps S414 and S416. The other steps of this embodiment are similar to those of the first embodiment, and are not redundantly described herein.

After the hard decoding process fails and the first histogram parameter h1 and the second histogram parameter h2 are generated, a probability value is generated according to the first histogram parameter h1, the second histogram parameter h2 and the decoding probability function fp(h1, h2) (Step S414). That is, after the first histogram parameter h1 and the second histogram parameter h2 are introduced into the decoding probability function fp(h1,h2) stored in the function storage unit 409, the probability value is obtained.

The controlling circuit 401 will determined whether the soft decoding process is performed according to the probability value. If the probability value is higher than a threshold value (Step S416), it means that the successful decoding probability of using the soft data is high. Consequently, the controlling circuit 401 subsequently performs the step S418. Whereas, if the probability value is lower than the threshold value, it means that successful decoding probability of using the soft data is low. Meanwhile, the controlling circuit 401 does not perform the soft decoding process. Then, the read retry step S405 of the hard decoding process is repeatedly done. That is, after the first histogram parameter h1 and the second histogram parameter h2 are generated according to the updated first sensing voltage Vs1 (Step S412), the soft decoding process is performed again.

FIG. 7 schematically illustrates another database storing associated data in various disturbing conditions. Similarly, before solid state storage device 40 leaves the factory, the non-volatile memory 405 is subjected to various disturbance experiments. After a set of predetermined sensing voltages (e.g., the first sensing voltage Vs1, the second sensing voltage Vs2 and the third sensing voltage Vs3) are applied to disturbed non-volatile memory 405, the first histogram parameter h1, the second histogram parameter h2 and the successful decoding probability are acquired.

In the condition set1, the first histogram parameter h1 is 500, and the second histogram parameter h2 is 2500. If the decoding operation is not successful according to this set of sensing voltages, the probability value is set as −1. In the condition set2, the first histogram parameter h1 is 1500, and the second histogram parameter h2 is 1500. If the decoding operation is successful according to this set of sensing voltages, the probability value is set as +1. In the condition set3, the first histogram parameter h1 is 2000, and the second histogram parameter h2 is 1000. If the decoding operation is successful according to this set of sensing voltages, the probability value is set as +1.

After the regression analysis is performed on the collected data of the database, the decoding probability function fp(h1,h2) is obtained. For example, the decoding probability function fp(h1,h2) is expressed as: fp(h1,h2)=0.0045×h1−0.003×h2. The decoding probability function fp(h1,h2) is stored in the function storage unit 409 of the controlling circuit 401.

For example, when the first histogram parameter h1 is 1000, and the second histogram parameter h2 is 1200. After the hard decoding process fails and before the soft decoding process is performed, the first histogram parameter h1 (=1000) and the second histogram parameter h2 (=1200) are introduced into the decoding probability function fp(h1,h2) in the step S414. Consequently, the calculated probability value is +0.9.

In case that the threshold value is 0, the probability value (+0.9) is higher than the threshold value, which means that the successful decoding probability of using the soft data is high. Consequently, the controlling circuit 401 subsequently performs the step S418. Whereas, if the calculated probability value is negative, it means that successful decoding probability of using the soft data is low. Meanwhile, the controlling circuit 401 does not perform the soft decoding process. Then, the hard decoding process is repeatedly done. That is, after the first histogram parameter h1 and the second histogram parameter h2 are generated according to the updated first sensing voltage Vs1, the soft decoding process is performed again.

From the above descriptions, the present invention provides a solid state storage device and a reading control method thereof. After the hard decoding process fails and before the soft decoding process is performed, a probability value is generated according to the first histogram parameter h1, the second histogram parameter h2 and the decoding probability function, which are generated according to three sensing voltages in the hard decoding process. The probability value is used for judging the successful decoding probability of using the soft data. Moreover, the updated first sensing voltage Vs1, the updated second sensing voltage Vs2 and the updated third sensing voltage Vs3 are generated and provided to the non-volatile memory 405 according to the first histogram parameter h1, the second histogram parameter h2 and the voltage shift function, which are generated in the hard decoding process. Consequently, the non-volatile memory 405 generates the soft data to the LDPC decoder and outputs the read data.

It is noted that numerous modifications and alterations may be made while retaining the teachings of the invention. In another embodiment, at least three sensing voltages are provided to the non-volatile memory in the hard decoding process, and the decoding operation is performed according to the generated hard data. Moreover, after the hard decoding process fails and before the soft decoding process is performed, at least two histogram parameters are generated according to the at least three sensing voltages, and the probability value is calculated according to the at least two histogram parameters and the decoding probability function. Moreover, if the number of the sensing voltages used in the hard decoding process and the number of the generated histogram parameters are increased, the result applied to the decoding probability function is more precise. Since the calculated probability value is more precise, the decoding result of the subsequent soft decoding process is more precise.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A solid state storage device, comprising:
   a non-volatile memory having a memory array composed of plural cells; and
   a controlling circuit connected with the non-volatile memory, and performing a hard decoding process and a soft decoding process on the non-volatile memory, wherein after the hard decoding process fails, the controlling circuit obtains a first histogram parameter and a second histogram parameter generated in the hard decoding process according to a first sensing voltage, a second sensing voltage and a third sensing voltage, wherein the first histogram parameter is the number of cells between the first sensing voltage and second sensing voltage and the second histogram parameter is the number of cells between the first sensing voltage and the third sensing voltage,
   wherein before the soft decoding process is performed, a voltage shift amount is obtained according to the first histogram parameter, the second histogram parameter and a voltage shift function relating to the first histogram parameter and the second histogram parameter, and the first sensing voltage, the second sensing voltage and the third sensing voltage are updated according to the voltage shift amount, wherein the non-volatile memory generates a soft data in the soft decoding process according to the updated first sensing voltage, the updated second sensing voltage and the updated third sensing voltage.

2. The solid state storage device as claimed in claim 1, the controlling circuit comprises:
   an error correction code unit comprising a hard decoder and a soft decoder, wherein the hard decoder generates the at least three hard data in the hard decoding process, and the soft decoder generates the soft data in the soft decoding process; and
   a function storage unit storing the voltage shift function.

3. The solid state storage device as claimed in claim 2, wherein the soft decoder of the controlling circuit generates a read data according to the soft data.

4. The solid state storage device as claimed in claim 2, wherein the function storage unit further stores a decoding probability function, wherein before the soft decoding process is performed, the controlling circuit generates a probability value indicating the successful decoding probability of the soft decoding process according to the first histogram parameter, the second histogram parameter and the decoding probability function, wherein according to the probability value, the controlling circuit determines whether the soft decoding process is performed or not.

5. A solid state storage device, comprising:
   a non-volatile memory having a memory array composed of plural cells; and
   a controlling circuit connected with the non-volatile memory, and performing a hard decoding process and a soft decoding process on the non-volatile memory, wherein after the hard decoding process fails, the controlling circuit obtains a first histogram parameter and a second histogram parameter generated in the hard decoding process according to a first sensing voltage, a second sensing voltage and a third sensing voltage, wherein the first histogram parameter is the number of cells between the first sensing voltage and second sensing voltage and the second histogram parameter is the number of cells between the first sensing voltage and the third sensing voltage,
   wherein before the soft decoding process is performed, the controlling circuit generates a probability value indicating the successful decoding probability of the soft decoding process according to the first histogram parameter, the second histogram parameter and a decoding probability function, wherein according to the probability value, the controlling circuit determines whether the soft decoding process is performed or not.

6. The solid state storage device as claimed in claim 5, the controlling circuit comprises:
   an error correction code unit comprising a hard decoder and a soft decoder, wherein the hard decoder generates a hard data in the hard decoding process, and the soft decoder generates a soft data in the soft decoding process; and
   a function storage unit storing the decoding probability function.

7. The solid state storage device as claimed in claim 5, wherein the first histogram parameter and the second histogram parameter are generated according to a first sensing voltage, a second sensing voltage and a third sensing voltage in the hard decoding process.

8. A reading control method for a solid state storage device, the reading control method comprising steps of:
   performing a hard decoding process on a non-volatile memory having a memory array composed of plural cells, wherein if the hard decoding process fails, a controlling circuit obtains a first histogram parameter and a second histogram parameter generated in the hard decoding process according to a first sensing voltage, a second sensing voltage and a third sensing voltage, wherein the first histogram parameter is the number of cells between the first sensing voltage and second sensing voltage and the second histogram parameter is the number of cells between the first sensing voltage and the third sensing voltage;
   obtaining a voltage shift amount according to the first histogram parameter, the second histogram parameter and a voltage shift function relating to the first histogram parameter and the second histogram parameter, wherein the first sensing voltage, the second sensing voltage and the third sensing voltage are updated according to the voltage shift amount; and
   performing a soft decoding process on the non-volatile memory,
   wherein the updated first sensing voltage, the updated second sensing voltage and the updated third sensing voltage are provided to the non-volatile memory, so that the non-volatile memory generates a soft data.

9. The reading control method as claimed in claim 8, further comprising a steps of generating a probability value indicating the successful decoding probability of the soft decoding process according to the first histogram parameter, the second histogram parameter and a decoding probability function, wherein according to the probability value, the controlling circuit determines whether the soft decoding process is performed or not.

10. The reading control method as claimed in claim 9, wherein if the probability value is lower than a threshold value, the soft decoding process is not performed.

11. The reading control method as claimed in claim 8, further comprising a step of allowing a soft decoder of the controlling circuit to generate a read data according to the soft data.

* * * * *